US010543685B2

(12) United States Patent
Naruse et al.

(10) Patent No.: US 10,543,685 B2
(45) Date of Patent: Jan. 28, 2020

(54) SEMICONDUCTOR DEVICE, METHOD OF MANUFACTURING SAME, LIQUID DISCHARGE HEAD, AND LIQUID DISCHARGE APPARATUS

(71) Applicant: CANON KABUSHIKI KAISHA, Tokyo (JP)

(72) Inventors: Hiroaki Naruse, Yokohama (JP); Akihiro Shimizu, Yokohama (JP); Toru Eto, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/015,536

(22) Filed: Jun. 22, 2018

(65) Prior Publication Data

US 2019/0001678 A1 Jan. 3, 2019

(30) Foreign Application Priority Data

Jun. 30, 2017 (JP) ................................. 2017-129598

(51) Int. Cl.
*B41J 2/14* (2006.01)
*B41J 2/16* (2006.01)

(52) U.S. Cl.
CPC ....... *B41J 2/14129* (2013.01); *B41J 2/14072* (2013.01); *B41J 2/1601* (2013.01)

(58) Field of Classification Search
CPC .. B41J 2/14129; B41J 2/14072; B41J 2/1601; B41J 2202/13; H01L 23/345
See application file for complete search history.

(56) References Cited

U.S. PATENT DOCUMENTS

| 6,685,304 B2 | 2/2004 | Miyamoto |
| 2013/0063527 A1* | 3/2013 | Ge .................... B41J 2/14056 347/63 |

FOREIGN PATENT DOCUMENTS

JP 2002-144571 A 5/2002

* cited by examiner

*Primary Examiner* — Geoffrey S Mruk
(74) *Attorney, Agent, or Firm* — Venable LLP (57) ABSTRACT

A semiconductor device used for a liquid discharge head is provided. The device includes a wiring layer, an insulating member formed above the wiring layer, a heat generation element arranged above and in contact with the insulating member, and electrically connected to the wiring layer, a metal member arranged above and in contact with the insulating member, and electrically connected to the wiring layer, and an electrically conductive member covering an upper surface of the metal member and electrically connected to the wiring layer through the metal member. A resistivity of the electrically conductive member is less than a resistivity of the metal member and a resistivity of the heat generation element. The heat generation element and the metal member are separated from each other.

12 Claims, 7 Drawing Sheets

SEMICONDUCTOR DEVICE, METHOD OF MANUFACTURING SAME, LIQUID DISCHARGE HEAD, AND LIQUID DISCHARGE APPARATUS

BACKGROUND OF THE INVENTION

Field of the Invention

The present invention relates to a semiconductor device, a method of manufacturing the same, a liquid discharge head, and a liquid discharge apparatus.

Description of the Related Art

As one printing method that uses an inkjet head which is a representative liquid discharge head, there is a method for discharging ink by causing ink to bubble by heating it with a heat generation element, and using these bubbles. Japanese Patent Laid-Open No. 2002-144571 recites smoothing at least one of materials sequentially stacked on a semiconductor substrate to thereby enable an upper protection film of a substrate for an ink-jet to be smoothed, and improve adhesiveness of a nozzle constituent member.

SUMMARY OF THE INVENTION

Having multiple wiring layers is one technique requested for a liquid discharge apparatus. In Japanese Patent Laid-Open No. 2002-144571, because all wiring layers are formed under a heat generation element, it is difficult to increase a number of wiring layers while maintaining planarity of an upper surface of a protective layer that covers the heat generation element. An aspect of the present invention is to improve the degree of freedom for the wiring layout of a conductive layer.

According to some embodiments, a semiconductor device used for a liquid discharge head, the device comprising: a wiring layer; an insulating member formed above the wiring layer; a heat generation element arranged above and in contact with the insulating member, and electrically connected to the wiring layer; a metal member arranged above and in contact with the insulating member, and electrically connected to the wiring layer; and an electrically conductive member covering an upper surface of the metal member and electrically connected to the wiring layer through the metal member, wherein a resistivity of the electrically conductive member is less than a resistivity of the metal member and a resistivity of the heat generation element, and wherein the heat generation element and the metal member are separated from each other is provided.

Further features of the present invention will become apparent from the following description of exemplary embodiments (with reference to the attached drawings).

DESCRIPTION OF THE EMBODIMENTS

Below, description is given in detail for embodiments of the present invention with reference to the accompanying drawings. The same reference numerals are given to similar elements throughout the various embodiments so duplicate descriptions are omitted. In addition, it is possible to appropriately change and combine each embodiment. A semiconductor device to be described below is mounted on a liquid discharge head as a substrate and used for a liquid discharge apparatus such as a copying machine, a facsimile apparatus, a word processor, or the like.

First Embodiment

Figure 1A:
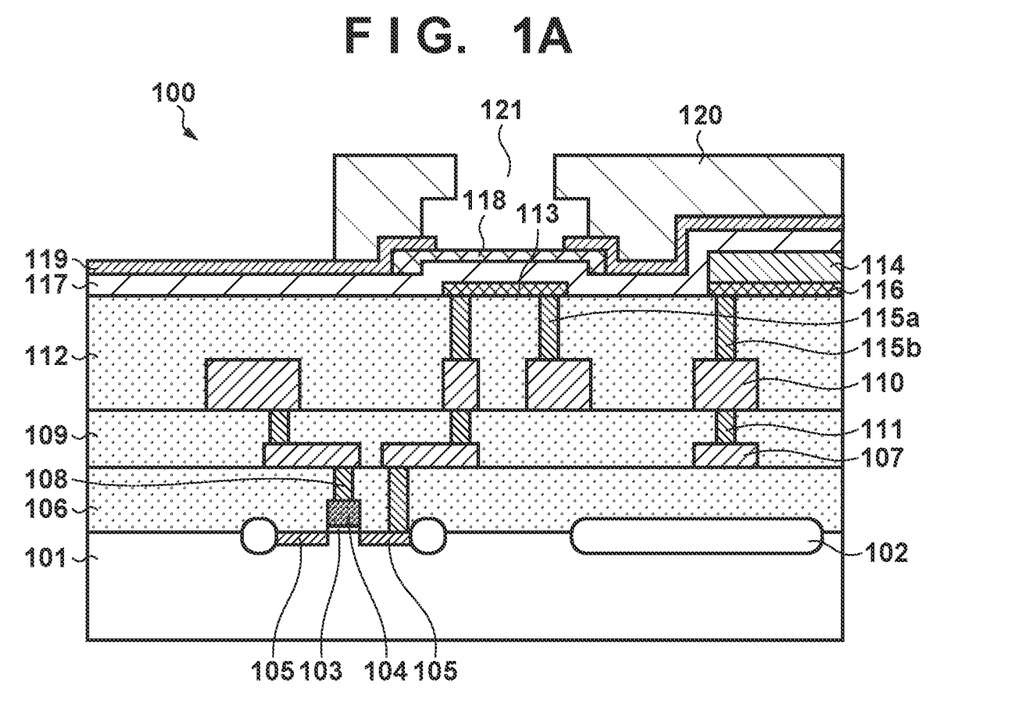
FIGS. 1A and 1B are views for illustrating an example of a structure of a semiconductor device of a first embodiment.
Figure 1B:
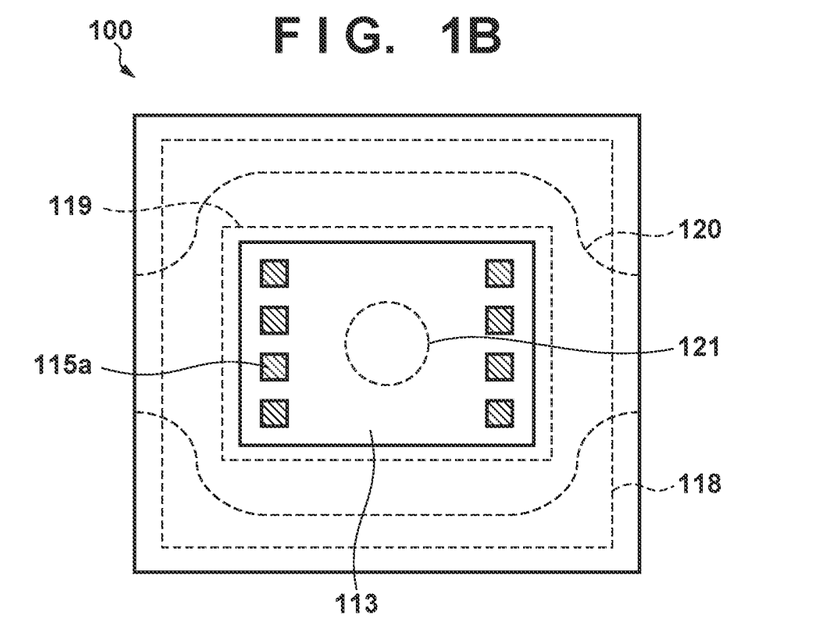

Referring to the schematic views of FIGS. 1A and 1B, description is given regarding a configuration of a semiconductor device 100 according to a first embodiment. FIG. 1A is a cross-sectional schematic view focusing on a part of the semiconductor device 100, and FIG. 1B is a planar schematic view focusing on a heat generation element 113 and a periphery thereof. In FIG. 1B, an anti-cavitation layer 118, an adhesion protective layer 119, a nozzle member 120 and an ink orifice 121 are indicated by outlines.

The semiconductor device 100 is provided with each constituent element illustrated in FIG. 1A. A gate oxide film 103, a gate electrode 104, and a source/drain region 105 that configure a MOS transistor for driving a heating element are arranged on a semiconductor substrate 101. In addition, an element isolation region 102 (for example, LOCOS) for separating elements such as MOS transistors is arranged on the semiconductor substrate 101.

An interlayer insulation layer 106 is arranged on the semiconductor substrate 101. A wiring layer 107 is arranged on the interlayer insulation layer 106. Each of the gate electrode 104 and the source/drain region 105 and the wiring layer 107 are connected to each other by conductive plugs 108. For example, the interlayer insulation layer 106 is formed by an SiO film which is deposited by a plasma CVD method, or a BPSG film which is deposited by a thermal CVD method. The wiring layer 107 is formed by an AlCu film that includes barrier metal such as Ti/TiN. The conductive plugs 108 are formed by a W film that includes barrier metal such as Ti/TiN.

An interlayer insulation layer 109 is arranged on the interlayer insulation layer 106 and the wiring layer 107. A wiring layer 110 is arranged on the interlayer insulation layer 109. The wiring layer 107 and the wiring layer 110 are connected to each other by conductive plugs 111. For example, the interlayer insulation layer 109 is formed by an SiO film that is deposited by a plasma CVD method. The wiring layer 110 is formed by an AlCu film that includes barrier metal such as Ti/TiN. The conductive plugs 111 are formed by a W film that includes barrier metal such as Ti/TiN.

An interlayer insulation layer 112 is arranged on the interlayer insulation layer 109 and the wiring layer 110. For example, the interlayer insulation layer 112 is formed by an SiO film that is deposited by a plasma CVD method. The SiO film formed by a CVD method that uses $SiH_4$ gas has low moisture content included in its film, and thus oxidation of the heat generation element 113 at a time of an ink discharge is suppressed. As a result, it is possible to reduce resistance variation of the heat generation element 113.

The heat generation element 113 and a metal member 116 are arranged on the interlayer insulation layer 112. An electrically conductive member 114 is arranged on the metal member 116. The electrically conductive member 114 covers an upper surface of the metal member 116, and is in contact with the upper surface of the metal member 116. A side surface of the electrically conductive member 114 and a side surface of the metal member 116 form the same surface. The heat generation element 113 and the wiring layer 110 are connected to each other by a conductive plug 115a. The metal member 116 and the wiring layer 110 are connected to each other by a conductive plug 115b.

As described above, the semiconductor substrate 101 includes a multilayer wiring layer that includes the wiring layers 107 and 110 and the interlayer insulation layer 109 and 112 which are insulating members formed thereon. The heat generation element 113 and the metal member 116 are arranged on the multilayer wiring layer, and are electrically connected to the wiring layers 107 and 110 included in the multilayer wiring layer. The electrically conductive member 114 is, via the metal member 116, electrically connected to the wiring layers 107 and 110 included in the multilayer wiring layer.

The heat generation element 113 and the metal member 116 are each arranged on and are in contact with the interlayer insulation layer 112. The heat generation element 113 and the metal member 116 are separated from each other, and are included in the same layer. Specifically, the heat generation element 113 and the metal member 116 are positioned with equal heights from the upper surface of the interlayer insulation layer 112. The heat generation element 113 and the metal member 116 are formed by the same material, such as TaSiN or WSiN, for example. The electrically conductive member 114 is formed by AlCu, for example. Accordingly, the resistivity, or the resistance ratio, of the electrically conductive member 114 is less than the resistivity of the metal member 116 and the resistivity of the heat generation element 113. Accordingly, because the electrically conductive member 114 can function as a wiring layer, it is possible to further make multiple wiring layers, and a degree of freedom for wiring layout of the conductive layer improves.

A protective layer 117, the anti-cavitation layer 118, an adhesion protective layer 119, and the nozzle member 120 are arranged on the heat generation element 113 and the electrically conductive member 114. The protective layer 117 is a layer for protecting the heat generation element 113 and the electrically conductive member 114 from ink. For example, the protective layer 117 is formed by silicon nitride. The protective layer 117 covers an upper surface and side surfaces of the heat generation element 113, an upper surface and a side surface of the electrically conductive member 114, a side surface of the metal member 116, and a portion of the interlayer insulation layer 112 that is not covered by the heat generation element 113 and the metal member 116.

The anti-cavitation layer 118 is a layer for protecting the heat generation element 113 and the protective layer 117 from cavitation arising when bubble disappears at a time of an ink discharge. For example, the anti-cavitation layer 118 is formed by a stacked film or single layer of a transition metal having high corrosion resistance, such as Ta or Ir. The anti-cavitation layer 118 covers the heat generation element 113, intermediated by the protective layer 117.

The adhesion protective layer 119 is a layer for improving adhesiveness between the anti-cavitation layer 118 and the nozzle member 120. For example, the adhesion protective layer 119 may be formed by an SiO film, an SiN film, or the like, and may be formed by an $Si_xC_yN_z$ film having higher ink dissolution resistance than these. The adhesion protective layer 119 has an opening above the heat generation element 113.

The nozzle member 120 configures an ink channel. For example, the nozzle member 120 is formed by a polyether amide resin. The nozzle member 120 has the ink orifice 121 above the heat generation element 113. The heat generation element 113 is positioned between the ink orifice 121 and the interlayer insulation layer 112. In a state where ink is supplied to the semiconductor device 100, when thermal energy generated by the heat generation element 113 is conveyed to the ink chamber, the ink bubbles, and the ink pushed by a bubble is discharged from the ink orifice 121.

Figure 2A:
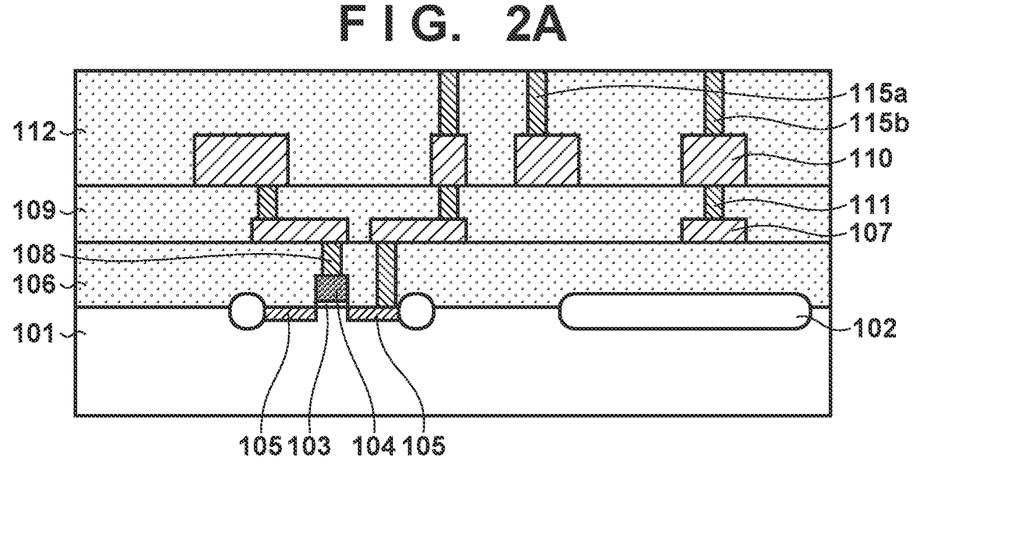
FIGS. 2A and 2B are views for illustrating an example of a method of manufacturing the semiconductor device of the first embodiment.

Next, with reference to FIG. 2A through FIG. 3B, description is given regarding a method of manufacturing the semiconductor device 100. Firstly, as illustrated in FIG. 2A, a structure having the plurality of interlayer insulation layers 106, 109, and 112, the plurality of wiring layers 107 and 110, and the conductive plugs 108, 111, 115a, and 115b is formed on the semiconductor substrate 101. Description is given below regarding a detailed method for forming this structure.

Firstly the element isolation region 102 is formed by a LOCOS method for example, and by for example forming each semiconductor region, the semiconductor substrate 101 having the gate oxide film 103, the gate electrode 104, and the source/drain region 105 is formed.

Next, the interlayer insulation layer 106 is formed by depositing a BPSG film by the thermal CVD method or depositing an SiO film by the plasma CVD method, and performing planarization by a CMP method. After forming the interlayer insulation layer 106, contact holes are opened in the interlayer insulation layer 106, a Ti/TiN film which is a barrier metal film is deposited by a sputtering method, and a W film is deposited by a CVD method. Subsequently, by removing everything besides the W film in the contact hole by a CMP method or an etch-back method, the conductive plugs 108 is formed.

Next, an AlCu film (an Al film to which Cu is added at 0.5 (atm %)) is deposited by a sputtering method, and the wiring layer 107 is formed by a photolithography process and a dry etching process. Subsequently, the interlayer insulation layer 109, the conductive plugs 111, and the wiring layer 110 are formed by similar procedures for the interlayer insulation layer 106, the conductive plugs 108, and the wiring layer 107.

Next, the interlayer insulation layer 112 is formed by depositing an SiO film by a plasma CVD method and performing planarization in accordance with a CMP method. Contact holes are opened in the interlayer insulation layer 112, a Ti/TiN film which is a barrier metal film is deposited by a sputtering method, and a W film is deposited by a CVD method. Subsequently the conductive plugs 115a and 115b are formed by removing everything besides tungsten in the contact holes by a CMP method. By repeating formation of these wiring layers, it is possible to add more wiring layers. Configuration may be taken to form a wiring layer by Cu using a damascene method in which the layer is formed by embedding a metal film in an insulating layer, instead of forming the wiring layer in accordance with depositing by sputtering of AlCu and a dry etching process. By the above, a multilayer wiring layer that includes the wiring layers 107 and 110 and the interlayer insulation layer 109 and 112 which are insulating members formed thereon is formed on the semiconductor substrate 101.

Figure 2B:
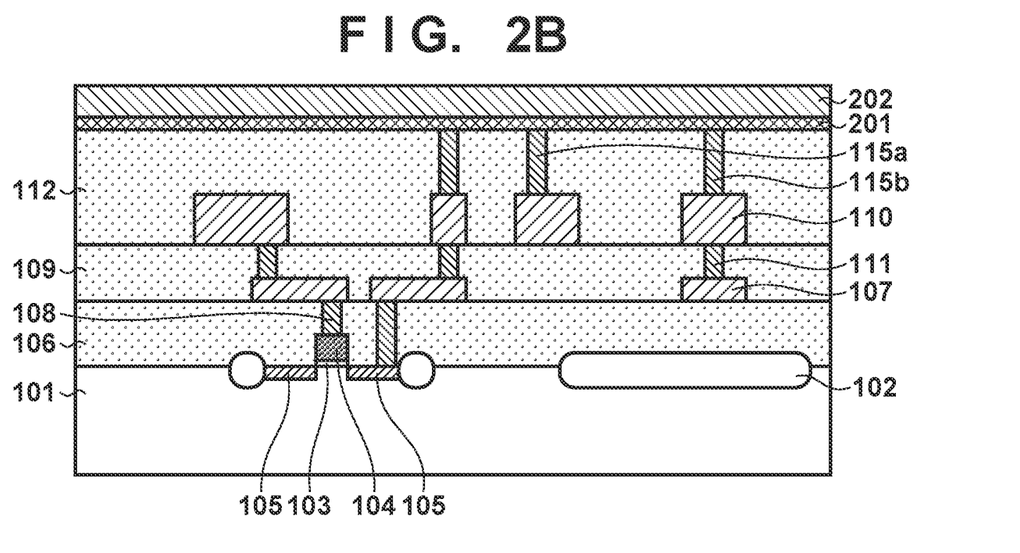

Next, as illustrated by FIG. 2B, a heat generation film 201 is formed on the interlayer insulation layer 112, and a conductive film 202 is formed on the heat generation film 201. For example, the heat generation film 201 is formed by depositing TaSiN or WSiN by a sputtering method. The conductive film 202 is formed by depositing AlCu by a sputtering method.

Figure 3A:
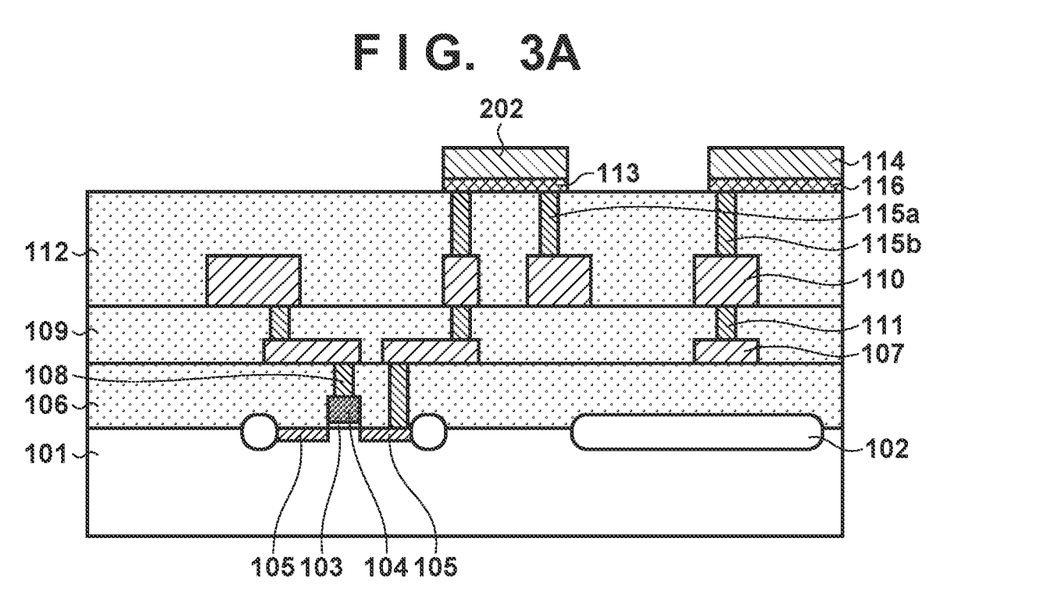
FIGS. 3A and 3B are views for illustrating an example of a method of manufacturing the semiconductor device of the first embodiment.

Next, as illustrated by FIG. 3A, a plurality of stacked bodies that are separated from each other are formed by performing patterning in accordance with a photolithography process and a dry etching process on a stacked film configured by the heat generation film 201 and the conductive film 202. A portion of the heat generation film 201 included in one stacked body becomes the heat generation element 113, and a portion of the heat generation film 201 included in a different stacked body becomes the metal member 116. A portion of the patterned conductive film 202 becomes the electrically conductive member 114.

Figure 3B:
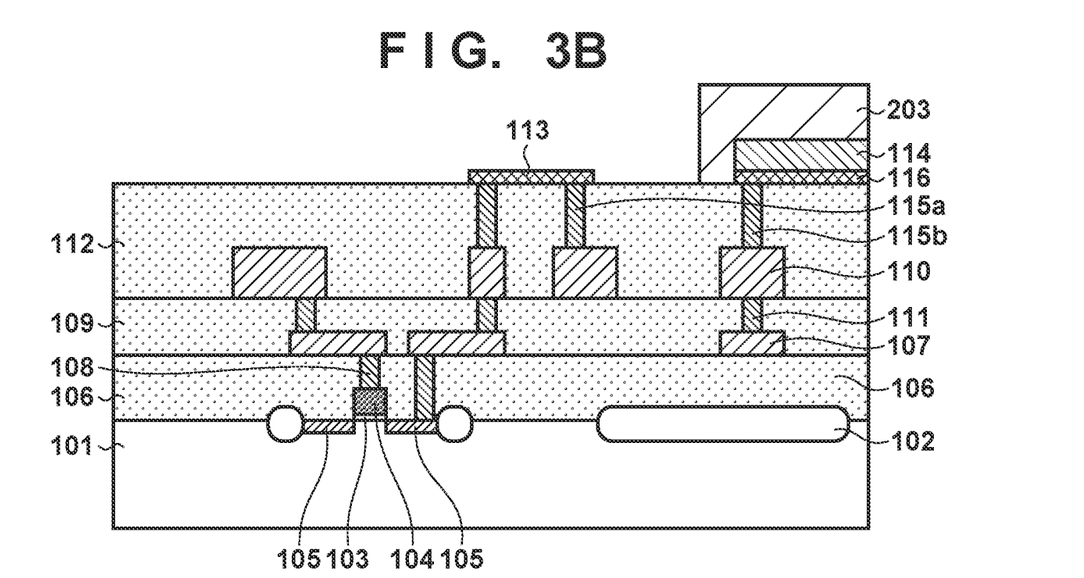

Next, as illustrated by FIG. 3B, a portion out of the conductive film 202 that was not removed and is to be used in the semiconductor device 100 is covered by a photoresist 203. Subsequently, the heat generation element 113 is formed by removing a portion out of the conductive film 202 included in one stacked body that is on the heat generation element 113. Because the conductive film 202 is an AlCu film, a wet etching method may be used instead of a dry etching method in this process so as to not cause plasma damage on the heat generation element 113. By this method, physical damage to the heat generation element 113 is reduced.

Subsequently, the semiconductor device 100 of FIGS. 1A and 1B is formed by removing the photoresist 203, and forming the protective layer 117, the anti-cavitation layer 118, the adhesion protective layer 119, and the nozzle member 120. For example, the protective layer 117 is formed by depositing an SiN film in accordance with a plasma CVD method. The anti-cavitation layer 118 is formed by depositing an anti-cavitation film material such as Ta or Ir by a sputtering method, and subsequently patterning this film by a photolithography process and a dry etching process. The adhesion protective layer 119 is formed by depositing an adhesion protective layer material comprising an SiO film, an SiN film, an $Si_xC_yN_z$ film, or the like by a plasma CVD method, and subsequently having a portion above the anti-cavitation layer 118 be an opening. The nozzle member 120 is formed by forming an ink channel by a polyether amide resin, and forming an opening for the ink orifice 121.

Second Embodiment

Figure 4:
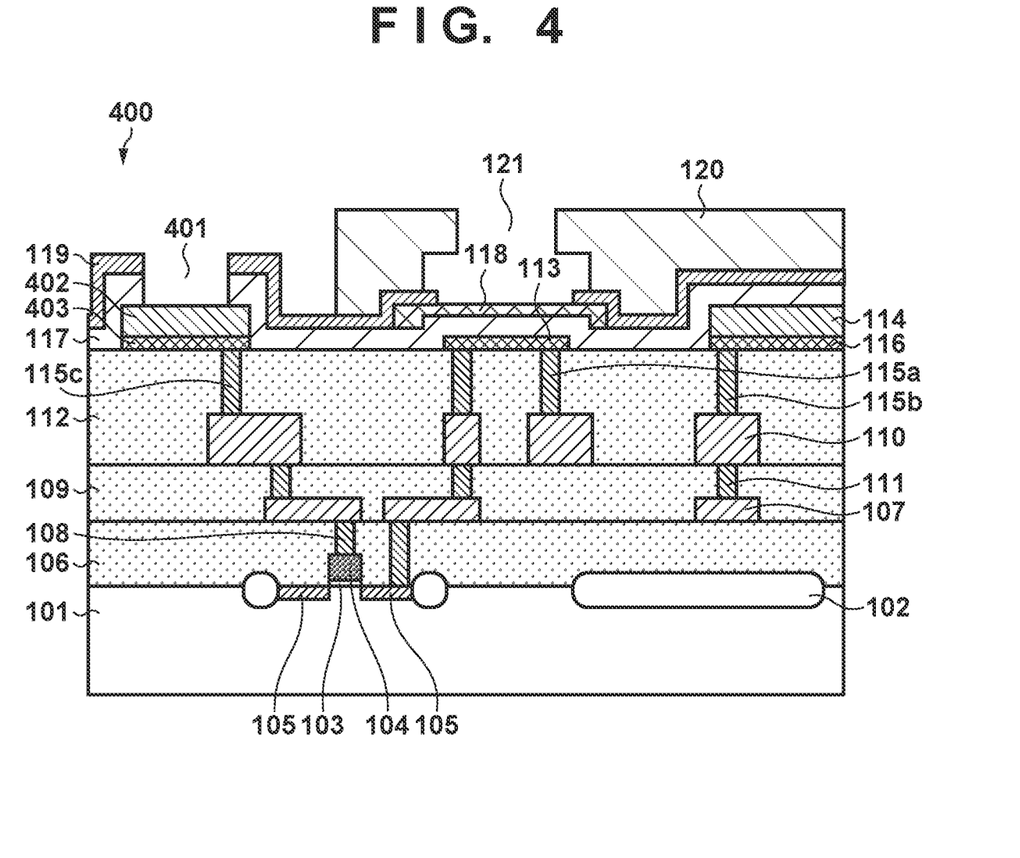
FIG. 4 is a view for illustrating an example of a structure of a semiconductor device of a second embodiment.

Referring to the schematic view of FIG. 4, description is given regarding a configuration of a semiconductor device 400 according to a second embodiment. FIG. 4 is a cross-sectional schematic view focusing on a part of the semiconductor device 400. Description is given below regarding points of difference between the semiconductor device 100 and the semiconductor device 400. A configuration of the semiconductor device 400 for which description is omitted may be the same as that of the semiconductor device 100.

The semiconductor device 400 is further provided with a metal member 403 and an electrically conductive member 402. The metal member 403 and the wiring layer 110 are connected to each other by a conductive plug 115*c*. Material or configuration of the metal member 403 may be the same as that of the metal member 116. Material or configuration of the electrically conductive member 402 may be the same as that of the electrically conductive member 114.

The protective layer 117 and the adhesion protective layer 119 have a pad opening portion 401 that exposes a portion of the upper surface of the electrically conductive member 402. In other words, an exposed portion out of the upper surface of the electrically conductive member 402 functions as a pad for an external connection. Specifically, the pad may be a pad for receiving supply of power from outside of the semiconductor device 100.

Figure 5A:
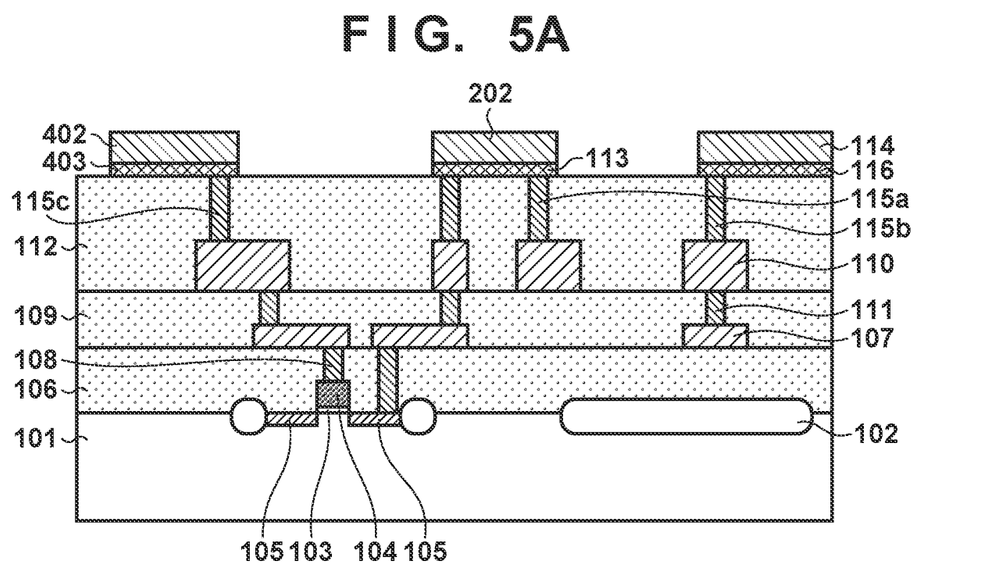
FIGS. 5A and 5B are views for illustrating an example of a method of manufacturing the semiconductor device of the second embodiment.
Figure 5B:
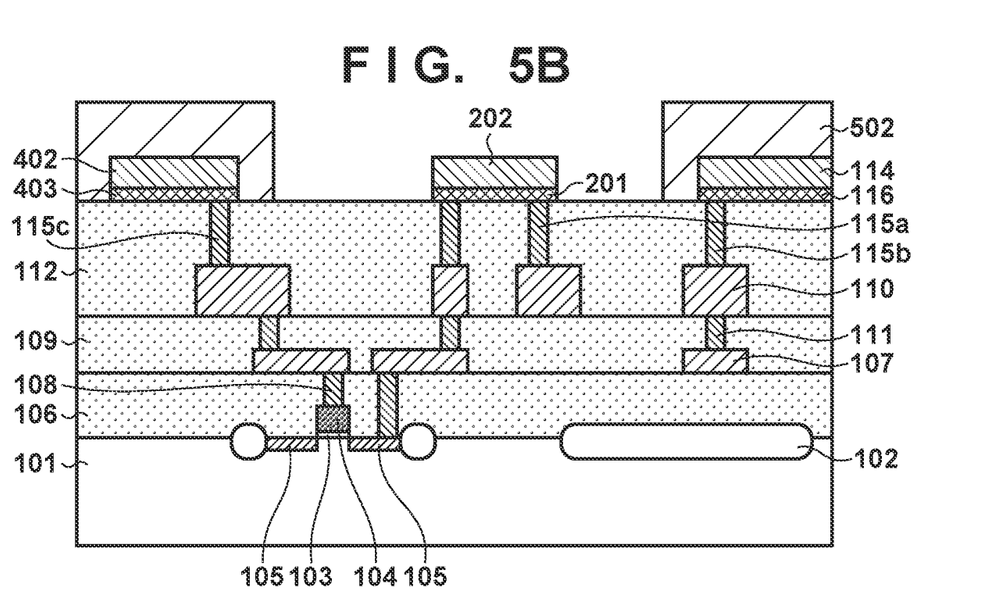

Next, with reference to FIGS. 5A and 5B, description is given regarding a method of manufacturing the semiconductor device 400. The structure of FIG. 2B is generated similarly to in the first embodiment. Subsequently, as illustrated by FIG. 5A, a plurality of stacked bodies that are separated from each other are formed by performing patterning in accordance with a photolithography process and a dry etching process on a stacked film configured by the heat generation film 201 and the conductive film 202. A portion of the heat generation film 201 included in one stacked body becomes the heat generation element 113, a portion of the heat generation film 201 included in a different stacked body becomes the metal member 116, and furthermore a portion of the heat generation film 201 included in a different stacked body becomes the metal member 403. A portion of the conductive film 202 included in one stacked body becomes the electrically conductive member 114, and a portion of the conductive film 202 included in a different stacked body becomes the electrically conductive member 402.

Next, as illustrated by FIG. 5B, a portion out of the conductive film 202 that was not removed and is to be used in the semiconductor device 400 is covered by a photoresist 502. Subsequently, the heat generation element 113 is formed by removing a portion out of the conductive film 202 included in one stacked body that is on the heat generation element 113. Subsequently, the photoresist 203 is removed to form the protective layer 117, the anti-cavitation layer 118, the adhesion protective layer 119, and the nozzle member 120. Furthermore, the semiconductor device 400 of FIG. 4 is formed by forming an opening in portions of the protective layer 117 and the adhesion protective layer 119 that cover the electrically conductive member 402.

Another Embodiment

Figure 6A:
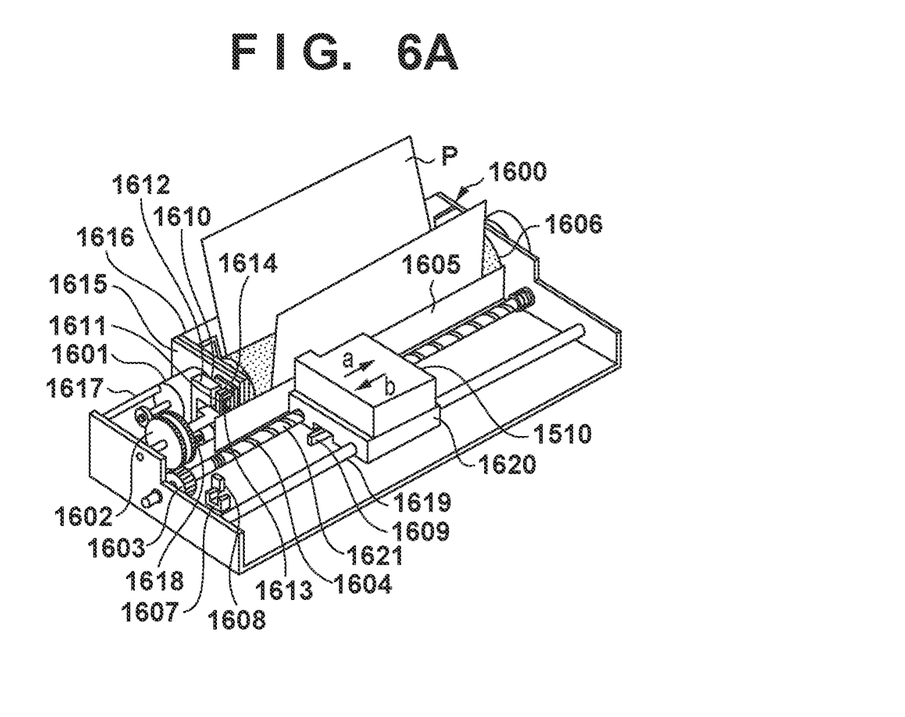
FIGS. 6A through 6D are views for illustrating other embodiments.

FIG. 6A exemplifies an internal configuration of a liquid discharge apparatus 1600 as typified by an ink-jet printer, a facsimile, a copy machine, or the like. In this example, the liquid discharge apparatus may be referred to as a printing apparatus. The liquid discharge apparatus 1600 includes a liquid discharge head 1510 that discharges a liquid (ink or a printing material in this example) to a predetermined medium P (a printing medium such as paper in this example). In the present example, the liquid discharge head may be referred to as a printhead. The liquid discharge head 1510 is mounted on a carriage 1620, and the carriage 1620 can be attached to a lead screw 1621 having a helical groove 1604. The lead screw 1621 can rotate in synchronism with rotation of a driving motor 1601 via driving force transfer gears 1602 and 1603. Because of this, the liquid discharge head 1510 can move in a direction of an arrow a orb following a guide 1619 together with the carriage 1620.

The medium P is pressed in a direction of movement of the carriage by a paper pressing plate 1605, and fixed in relation to a platen 1606. The liquid discharge apparatus 1600 reciprocates the liquid discharge head 1510 and performs liquid discharge (printing in this example) onto the medium P conveyed onto the platen 1606 by a conveyance unit (not shown).

Also, the liquid discharge apparatus 1600, via photocouplers 1607 and 1608, confirms the position of a lever 1609 disposed on the carriage 1620, and switches the rotation direction of the driving motor 1601. A support member 1610 supports a cap member 1611 for covering the nozzles (liquid orifices or simply orifices) of the liquid discharge head 1510. A suction unit 1612 performs recovery processing of the liquid discharge head 1510 by sucking the interior of the cap member 1611 via an intra-cap opening 1613. A lever 1617 is provided to start recovery processing by suction, and moves along with movement of a cam 1618 engaged with the carriage 1620. A driving force from the driving motor 1601 is controlled by a well-known transfer mechanism such as clutch switching.

Also, a main body support plate 1616 supports a moving member 1615 and a cleaning blade 1614, and the moving member 1615 causes the cleaning blade 1614 to move, and performs a recovery process of the liquid discharge head 1510 by wiping. A control unit (not shown) is also provided in the liquid discharge apparatus 1600, and this control unit controls driving of each mechanism described above.

Figure 6B:
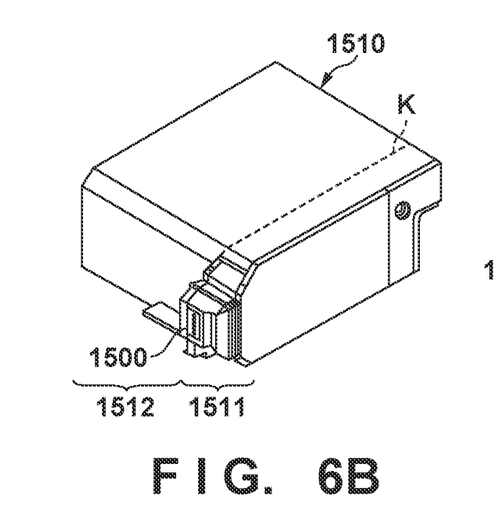

FIG. 6B exemplifies an outer appearance of the liquid discharge head 1510. The liquid discharge head 1510 can include a head unit 1511 including a plurality of nozzles 1500, and a tank (liquid containing unit) 1512 that holds a liquid to be supplied to the head unit 1511. The tank 1512 and the head unit 1511 can be isolated at, for example, a broken line K, and the tank 1512 can be changed. The liquid discharge head 1510 includes an electrical contact (not shown) for receiving an electrical signal from the carriage 1620, and discharges a liquid in accordance with the electrical signal. The tank 1512 includes, for example, a fibrous or porous liquid holding member (not shown), and can hold a liquid by the liquid holding member.

Figure 6C:
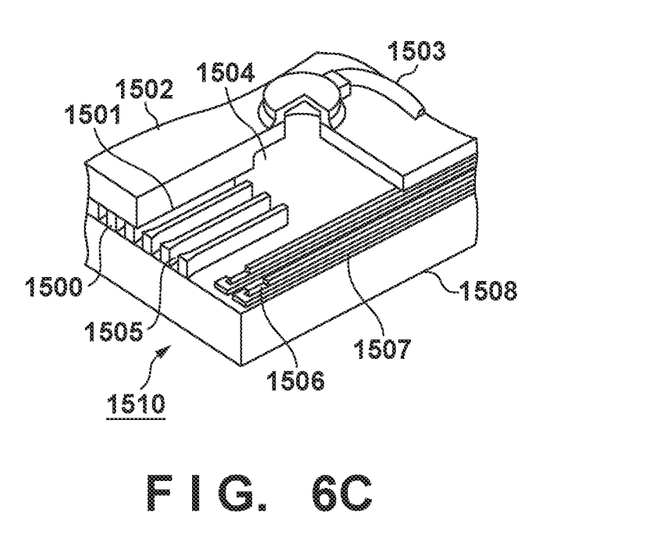

FIG. 6C exemplifies an internal configuration of the liquid discharge head 1510. The liquid discharge head 1510 includes a substrate 1508, channel wall members 1501 that are arranged on the substrate 1508 and form channels 1505, and a top plate 1502 having a liquid supply path 1503. The substrate 1508 may be either of the semiconductor devices 100 and 400 described above. In addition, discharge elements or liquid discharge elements, heaters 1506 (electrothermal transducers) are arrayed on the substrate (liquid discharge head substrate) of the liquid discharge head 1510, in correspondence with the respective nozzles 1500. When a driving element (switching element such as a transistor) provided in correspondence with each heater 1506 enters a conductive state, the heater 1506 is driven to generate heat.

The liquid from the liquid supply path 1503 is stored in a common liquid chamber 1504, and supplied to each of the nozzles 1500 via the channels 1505. The liquid supplied to each nozzle 1500 is discharged from the nozzle 1500 in response to driving of the heater 1506 corresponding to the nozzle 1500.

Figure 6D:
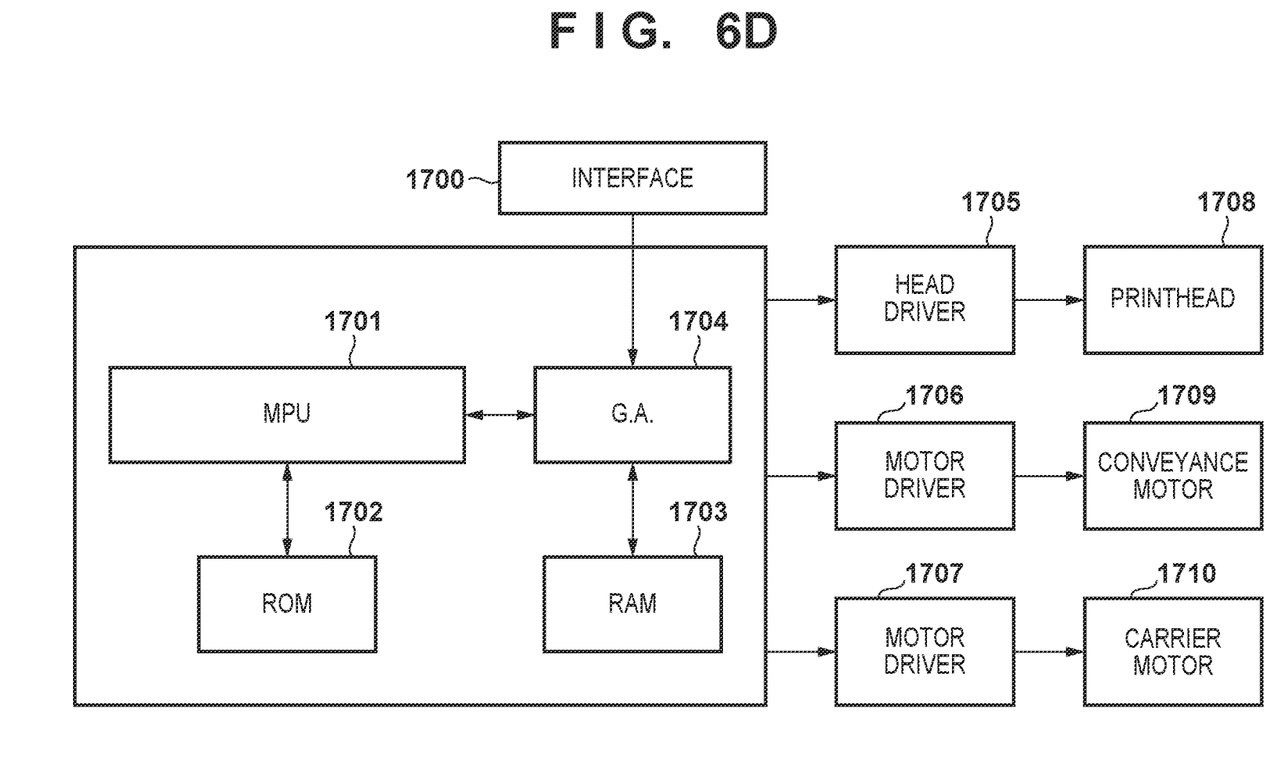

FIG. 6D exemplifies a system configuration of the liquid discharge apparatus 1600. The liquid discharge apparatus 1600 includes an interface 1700, an MPU 1701, a ROM 1702, a RAM 1703, and a gate array (G.A.) 1704. An external signal for executing a liquid discharge is inputted from outside to the interface 1700. The ROM 1702 stores a control program that the MPU 1701 executes. The RAM 1703 saves various signals or data such as the previously described external signal for liquid discharge or data supplied to a liquid discharge head 1708. The gate array 1704 performs data supply control corresponding to the liquid discharge head 1708, and performs control of data transfer between the interface 1700, the MPU 1701, and the RAM 1703.

The liquid discharge apparatus 1600 also has a head driver 1705, as well as motor drivers 1706 and 1707, a conveyance motor 1709, and a carrier motor 1710. The carrier motor 1710 conveys the liquid discharge head 1708. The conveyance motor 1709 conveys the medium P. The head driver 1705 drives the liquid discharge head 1708. The motor drivers 1706 and 1707 drive the conveyance motor 1709 and the carrier motor 1710 respectively.

When a driving signal is inputted into the interface 1700, this driving signal can be converted into data for liquid discharge between the gate array 1704 and the MPU 1701. In accordance with this data, each mechanism performs a desired operation, and in this way, the liquid discharge head 1708 is driven.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-129598, filed Jun. 30, 2017, which is hereby incorporated by reference herein in its entirety.

What is claimed is:

1. A semiconductor device used for a liquid discharge head, the device comprising:
   a wiring layer including a first wiring and a second wiring;
   an insulating member formed above the first wiring and the second wiring;
   a heat generation element arranged above and in contact with the insulating member, and electrically connected to the first wiring;
   a conductive plug arranged in the insulating member;
   a metal member arranged above and in contact with the insulating member, and electrically connected to the second wiring; and
   an electrically conductive member covering an upper surface of the metal member and electrically connected to the second wiring,
   wherein a part of the metal member is arranged between the conductive plug and the electrically conductive member in a direction perpendicular to the upper surface of the metal member,
   wherein a resistivity of the electrically conductive member is less than a resistivity of the metal member and a resistivity of the heat generation element, and
   wherein the heat generation element and the metal member are separated from each other.

2. The device according to claim 1, wherein the heat generation element and the metal member are formed by a same material.

3. The device according to claim 1, wherein the electrically conductive member is in contact with the upper surface of the metal member.

4. The device according to claim 1, wherein a side surface of the electrically conductive member and a side surface of the metal member form a same surface.

5. The device according to claim 1, wherein the heat generation element and the first wiring are connected to each other by a conductive plug.

6. The device according to claim 1, further comprising a protective layer covering an upper surface of the heat generation element and an upper surface of the electrically conductive member.

7. The device according to claim 1, wherein a portion of an upper surface of the electrically conductive member functions as a pad for an external connection.

8. The device according to claim 7, wherein the pad is a pad for receiving supply of power from outside of the semiconductor device.

9. The device according to claim 1, further comprising a nozzle member having an orifice,
wherein the heat generation element is positioned between the orifice and the insulating member.

10. The device according to claim 1, wherein the heat generation element and the metal member are separated from each other at least in a layer where the heat generation element and the metal member are provided.

11. A liquid discharge head comprising the semiconductor device according to claim 1, and an orifice for which discharge of liquid is controlled by the semiconductor device.

12. A liquid discharge apparatus having the liquid discharge head according to claim 11, and a supply unit configured to supply a driving signal for causing the liquid discharge head to discharge liquid.

* * * * *